(12) United States Patent
Oja et al.

(10) Patent No.: US 11,190,133 B2
(45) Date of Patent: Nov. 30, 2021

(54) OVEN-CONTROLLED FREQUENCY REFERENCE OSCILLATOR AND METHOD OF FABRICATING THEREOF

(71) Applicant: KYOCERA Tikitin Oy, Espoo (FI)

(72) Inventors: Aarne Oja, Espoo (FI); Antti Jaakkola, Espoo (FI)

(73) Assignee: KYOCERA Tikitin Oy, Espoo (FI)

( * ) Notice: Subject to any disclaimer, the term of this patent is extended or adjusted under 35 U.S.C. 154(b) by 0 days.

(21) Appl. No.: 16/640,837

(22) PCT Filed: Sep. 5, 2018

(86) PCT No.: PCT/FI2018/050627
§ 371 (c)(1),
(2) Date: Feb. 21, 2020

(87) PCT Pub. No.: WO2019/048737
PCT Pub. Date: Mar. 14, 2019

(65) Prior Publication Data
US 2021/0135626 A1   May 6, 2021

(30) Foreign Application Priority Data
Sep. 5, 2017  (FI) ...................... 20175792

(51) Int. Cl.
  *H03B 5/04*   (2006.01)
  *H01L 41/047*  (2006.01)
  *H03B 5/32*   (2006.01)
(52) U.S. Cl.
  CPC ............. *H03B 5/04* (2013.01); *H01L 41/047* (2013.01); *H03B 5/32* (2013.01)

(58) Field of Classification Search
  CPC ............. H03B 5/04; H03B 5/32; H01L 41/047
  See application file for complete search history.

(56) References Cited

U.S. PATENT DOCUMENTS

2012/0013410 A1   1/2012   Rebel et al.
2016/0099704 A1   4/2016   Jaakkola et al.
(Continued)

FOREIGN PATENT DOCUMENTS

WO   2012110708 A1   8/2012
WO   2016051022 A1   4/2016
WO   2016205770 A1   12/2016

OTHER PUBLICATIONS

A. Daruwalla et al., "Distributed Lame mode resonators fortemperature-stable high frequency mems oscillators", 2017.
(Continued)

*Primary Examiner* — Jeffrey M Shin
(74) *Attorney, Agent, or Firm* — Ziegler IP Law Group, LLC

(57) ABSTRACT

A temperature-compensated microelectromechanical oscillator and a method of fabricating thereof. The oscillator includes a resonator element including highly doped silicon and an actuator for exciting the resonator body into a resonance mode having a characteristic frequency-vs-temperature curve. The properties of the resonator element and the actuator are chosen such that the curve has a high-temperature turnover point at a turnover temperature of 85° C. or more. In addition, the oscillator comprises a thermostatic controller for keeping the temperature of the resonator element at said high turnover temperature.

19 Claims, 2 Drawing Sheets

(56) References Cited

U.S. PATENT DOCUMENTS

2017/0230030 A1* 8/2017 Doll .................. H03H 9/125
2017/0250691 A1* 8/2017 Arai .................. H03L 1/02

OTHER PUBLICATIONS

Jaakkola, A. et al, "Piezoelectrically Transduced Single-Crystal-Silicon Plate Resonators." In IEEEUltrasonics Symposium, 2008. IUS 2008, 717-20, 2008.

Jaakkola, Antti. "Piezoelectrically Transduced Temperature Compensated Silicon Resonators forTiming and Frequency Reference Applications." Doctoral dissertation, Aalto University, 2016.http://urn.fi/URN:ISBN:978-951-38-8387-4.

L. Luschi et al., Temperature Compensation of Silicon LameResonators Using Etch Holes: Theory and Design Methodology, vol. 64, No. 5, May 2017.

M. Shahmohammadi et al., "Turnover Temperature Point inExtensional-Mode Highly Doped Silicon Microresonators", vol. 60, No. 3, Mar. 2013.

Vig, J., and Yoonkee Kim. "The Low-Power Potential of Oven-Controlled Mems Oscillators." IEEETransactions on Ultrasonics, Ferroelectrics, and Frequency Control 60, No. 4 (Apr. 2013): 851-53. doi:10.1109/TUFFC.2013.2634.

W. You et al., "Oven controlled N++ [1 0 O] length-extensionalmode silicon resonator with frequency stability of 1 ppm over industrialtemperature range", Journal of Micromechanics and Micoengineering, Published Aug. 2, 2017.

Yunhan Chen et al., "Ovenized Dual-Mode Clock (ODMC) Based on Hightly Doped Single CrystalSilicon Resonators", 2016 29th IEEE International Conference on Micro Electro MechanicalSystems (MEMS), pp. 91-94, Jan. 2016.

Finnish Patent and Registration Office, Search Report, Application No. 20175792, dated Mar. 6, 2020.

Patent Cooperation Treaty, Written Opinion of The Intenational Searching Authority, Application No. PCT/FI2018/050627, dated Dec. 13, 2018, 5 Pages.

Patent Cooperation Treaty, International Search Report, Application No. PCT/FI2018/050627, dated Dec. 13, 2018, 5 Pages.

European Patent Office, Extended European Search Report, Application No. 18853721.1, dated May 4, 2021, 10 pages.

Jaakkola et al, "Second Order Temperature Compensated Piezoelectrically Driven 23 MHz Heavily Doped Silicon Resonators with + 10ppm Temperature Stability" 2015 Joint Conference of the IEEE International Frequency Control Symposium & The European Frequency and Time Forum, pp. 420-422, XP055382773, DOI: 10.1109/FCS.2015.7138871, Jan. 1, 2015, 3 pages.

You et al, "Micro-Oven-Controlled N++ [100] Length-Extensional-Mode Oscillator for Near Zero Temperature Drift", 2016 IEEE 29th International Conference On Micro Electro Mechanical Systems (MEMS), IEEE, pp. 982-985, XP032874799, DOI: 10.1109/MEMSYS.2016.7421797, Jan. 24, 2016, 4 pages.

\* cited by examiner

OVEN-CONTROLLED FREQUENCY REFERENCE OSCILLATOR AND METHOD OF FABRICATING THEREOF

FIELD

The aspects of the disclosed embodiments relate to microelectromechanical (MEMS) oscillators. In particular, the aspects of the disclosed embodiments relate to MEMS oscillators that are temperature-compensated for stabilizing their operational frequency.

BACKGROUND

Traditionally frequency reference oscillators contain a quartz crystal as a resonating element, which mainly determines the frequency and other properties of their output signal. Quartz crystals are stable but also suffer from some drawbacks such as relatively large size and difficulty of integration within electronic circuits.

Several attempts have addressed the issue of using a MEMS resonator, as an alternative to quartz resonator, as a stable frequency reference. The frequency of pure silicon crystal resonators has a strong linear temperature dependency, which makes the resonators unusable in varying temperatures. Doping of the silicon crystal can be used to even out the frequency-vs-temperature curve to some extent at the intended operational range of the resonator, typically around the room temperature. For example, Jaakkola, Antti. "Piezoelectrically Transduced Temperature Compensated Silicon Resonators for Timing and Frequency Reference Applications." Doctoral dissertation, Aalto University, 2016 and WO 2012/110708 A1 discuss the effect of doping on silicon resonators.

US 2012/0013410 A1 discloses a method utilizing a polynomial temperature calibration scheme to tune the oscillator circuit for providing a plateau into the frequency-vs-temperature curve for providing a stable frequency range.

Above-mentioned solutions can be used for providing relatively stable resonators but only at a relatively narrow temperature range. Also the tuning circuitry required make the oscillators relatively complex and potentially provide additional sources of errors with respect to stability or phase noise characteristics of the oscillator.

So called OCXOs, i.e., oven controlled crystal oscillators are devices, where a quartz crystal is heated to a constant temperature, where the frequency-vs-temperature curve has an inclination point, i.e., a so-called turnover point. At this temperature, the first derivative of the frequency-vs-temperature curve is zero, and when the temperature is kept around the turnover point a stable oscillator output frequency can be obtained. Typically this turnover temperature can be, for example, around 90 C, and thus operation below temperatures of 80 C can be realized with a temperature control based on heating of the crystal element in a thermally isolated enclosure, ie., an oven.

So-called oven-controlled MEMS oscillators (OCMOs) can also be designed if a MEMS resonator with a frequency-vs-temperature curve having a turnover point at an elevated temperature can be created. MEMS resonators are considerably smaller in dimensions than quartz crystals, and thus the oven needed for an OCMO can be much less power consuming than that for an OCXO. Other benefits include smaller overall size of the component and faster startup time of the oscillator due to smaller time constant of the oven, as discussed in Vig, J., and Yoonkee Kim. "The Low-Power Potential of Oven-Controlled Mems Oscillators." IEEE Transactions on Ultrasonics, Ferroelectrics, and Frequency Control 60, no. 4 (April 2013): 851-53. doi:10.1109/TUFFC.2013.2634.

Yunhan Chen et al, "Ovenized Dual-Mode Clock (ODMC) Based on Highly Doped Single Crystal Silicon Resonators", 2016 29th IEEE International Conference on Micro Electro Mechanical Systems (MEMS), pp. 91-94, January 2016 discloses a solution, where a centrally anchored square plate resonator is heated to a constant temperature and driven simultaneously into two resonance modes having different resonance frequencies. The resonance frequencies are tracked and the frequency difference between the two modes is used as a thermometer to provide feedback to a control loop of the resonator to stabilize the resonator. While allowing for relatively wide range of operation, the compensation scheme is also relatively complex due to the involvement of two frequencies simultaneously, for example as concerns the anchoring and control circuit realizations. However, the performance in terms of frequency stability under varying ambient temperature was still found inferior to that of quartz based OCXOs.

Existing OCMOs suffer in general from lower frequency stability due to their worse frequency-vs-temperature characteristics at the turnover temperature. To reach similar stability over varying ambient temperature in OCMOs, much more accurate temperature control of the oven would be needed than what is used in quartz based OCXOs today.

There is a need for improved oven-controlled MEMS oscillators.

SUMMARY

It is an aim of the aspects of the disclosed embodiments to provide an oven-controlled MEMS oscillator that is more stable than previous OCMOs. In particular, it is an aim to provide an oscillator having frequency-vs-temperature characteristics that do not set practically unfeasible requirements for the accuracy of the oven temperature control.

One aim is to provide an OCMO that has a stable frequency over a broad temperature range, in particular up to 85° C.

An aim is also to provide an oscillator that is simple to implement, in particular as concerns the circuitry required.

The aspects of the disclosed embodiments are based on the observation that by increasing the average doping concentration of silicon to a level of 9*1019 cm-3 or more, one can achieve a resonator whose turnover point is at a temperature of 85° C. or more and simultaneously has a very low curvature of the frequency-vs-temperature curve at the turnover point. Thus, changes in the ovenization temperature reflect only minimally to the frequency of the resonator. One specific observation is that some resonators that were previously believed to have a frequency-vs-temperature turnover point at a relatively low temperature, actually exhibit another turnover point at a high temperature. This another turnover point too can be utilized as the ovenization temperature of the resonator in order to stabilize the output frequency of the oscillator.

According to a first aspect, the disclosed embodiments provide a temperature-compensated microelectromechanical oscillator comprising a resonator element comprising doped silicon, an actuator for exciting the resonator element into a resonance mode having a characteristic frequency-vs-temperature curve, and a thermostatic controller for keeping the temperature of the resonator element at said high turnover temperature. The doping concentration of the resonator element is at least 9*1019 cm-3 and chosen to provide a high-temperature turnover point at a turnover temperature of 85° C. or more in the chosen resonator geometry and resonance mode.

According to further aspects, the high-temperature turnover point is the only turnover point of the curve within the temperature range of −40 . . . +150° C. This can be in particular achieved with doping concentrations of 9*1019-1.3*1020 cm-3.

Alternatively, the curve has two turnover points, one or both of which are located at a temperature higher than 85° C. Either one of these, typically the one that is the first above 85° C. can be used as the ovenization point. This can be achieved in particular with doping concentrations of 1.1*1020 cm-3 or more, such as 1.3*1020 cm-3 or more.

According to one aspect, the disclosed embodiments provided a temperature-compensated microelectromechanical oscillator comprising a resonator element comprising doped silicon and an actuator for exciting the resonator body into a resonance mode having a characteristic frequency-vs-temperature curve. The properties of the resonator element and the actuator are chosen such that the curve has at least two turnover points. In accordance with the aspects of the disclosed embodiments, at least one of the turnover points is a high-temperature turnover point at a turnover temperature of 85° C. or more. In addition, the oscillator comprises a thermostatic controller for keeping the temperature of the resonator element at said high turnover temperature.

According to a second aspect, the disclosed embodiments provide a method of fabricating a microelectromechanical oscillator. The method comprises choosing a resonator geometry for a resonator element, choosing a resonator material comprising doped silicon, and choosing an actuator for providing the resonator element in the resonator geometry chosen to oscillate in a resonance mode. According to the aspects of the disclosed embodiments, it is evaluated whether the resonator geometry, resonator material, actuation means and resonance mode chosen produce a frequency-vs-temperature curve having a high-temperature turnover point at a high turnover temperature of 85° C. or more. If this kind of behavior is found, the oscillator is manufactured with the chosen resonator geometry, resonator material, and actuator, further providing the oscillator with a thermostatic controller for keeping the temperature of the resonator element at the high turnover temperature.

In particular, the aspects of the disclosed embodiments are characterized by what is stated in the independent claims.

The aspects of the disclosed embodiments offer significant benefits. It has been found that the turnover point of a silicon resonator can be "pushed" to a high enough temperature to serve as an ovenization temperature to cover the whole practical temperature region of electronic devices and simultaneously flattening the turnover point to provide a very stable spot in terms of frequency. A key to this is the ultra-high doping concentration of the silicon material. Preferred material, resonator geometry and resonance mode combinations are exemplified later.

In particular, it has been shown that the absolute value of the curvature of the frequency-vs-temperature curve at the turnover point is brought to the level of 20 ppb/C2 or less, and even 10 ppb/C2 or less. This is contrast to conventional ovenized resonators, in which the curvature is even at best in the order of 50 ppb/C2, which is more than 10 times worse than that in quartz crystals used in OCXOs. The present disclosure, however, brings the curvature, and thus the frequency stability, close to the quartz performance.

The present frequency-vs-temperature behavior can be achieved using readily available resonator geometries, resonance modes and actuation schemes, which are exemplified in detail later in this document.

The dependent claims are directed to selected embodiments of the present disclosure.

In some embodiments, there are two turnover temperatures in the frequency-vs-temperature curve, at least one of which is "pushed" to above 85° C. for ovenization. For achieving this, advantage is take of third-order temperature behavior of certain resonators. This approach differs from some conventional approaches, where the design aim has been to minimize TCF components not only to the first order, but also to higher orders, or to provide a certain (relatively narrow) temperature-stable frequency region around room temperature, for example. In some embodiments, one of the two turnover points of the frequency-vs-temperature curve is located at a temperature of less than 85° C., in which case the high-temperature turnover point is typically a local maximum. This kind of behavior is found in particular in resonators, whose doping concentration is 1.1*1020 cm-3 or more.

The high-temperature turnover point is typically located at a turnover temperature of 200° C. or less, in particular 150° C. or less, such as 130° C. or less.

In some embodiments, the frequency-versus-temperature curve has exactly two turnover points within the temperature range of −40 . . . +150° C.

In some embodiments, the frequency-vs-temperature curve has at the high-temperature turnover point used as the ovenization point a smaller absolute value of curvature that at the low-temperature turnover point.

In the case of two-turnover point solutions and degenerately n-doped silicon plate resonators, the high-temperature turnover point is typically a local maximum. It is, however, not excluded that the turnover point would be a local minimum, in particular with some other material configuration.

In some embodiments, the resonator is a square plate resonator or a rectangular plate resonator.

In some embodiments, the resonator is a plate resonator having an aspect ratio different from 1. In one example, which is preferred in particular in the case of electrostatically actuated plates, the aspect ratio is less than 2. In one example, preferred in particular in the case of piezoelectrically actuated plates, the aspect ratio is 2±10%.

In some embodiments, the resonator is a beam resonator. In some embodiments, the beam is oblique with respect to the [100] silicon crystal direction.

In some embodiments, the resonance mode of the resonator is in square extensional/width extensional mode branch (including overtones). In an alternative embodiment, the resonance mode is in the in-plane flexural, out-of-plane flexural, or length extensional/Lamé modal branch (including overtones). This means that the main mode that arises in the resonator belongs to the mentioned branch.

In general, the resonance mode used can be an extensional mode, such as a width extensional mode or square extensional mode, flexural mode, such as an in-plane flexural mode, a shear mode, or a mode having characteristics from two or more of these modes. These mode shapes in particular have been found to provide desired design degrees of freedom, in particular with respect to the aspect ratio of the plate, angle of the plate with respect to the silicon crystal, and doping, so as to be able to realize the resonator with the desired properties in practice.

In some embodiments, the silicon of the resonator element is a piezoelectrically actuated composite resonator doped to an average concentration of at least $1.3*1020$ cm-3 or more.

In some embodiments, the thermostatic controller is adapted to operate independently of the oscillation frequency of the resonator element. That is, there is no feedback loop from the frequency output of the resonator to the controller that would be used to regulate the temperature of the resonator, but the controller uses direct, e.g. thermistor-based, temperature sensing. This ensures high stability of the oscillator.

Next, embodiments of the present disclosure and advantages thereof are discussed in more details with reference to the attached drawings.

BRIEF DESCRIPTION OF THE DRAWINGS

FIGS. 4A-4C show graphs of three different frequency-vs-temperature curves in accordance with embodiments of the present disclosure.

DETAILED DESCRIPTION OF EMBODIMENTS

Definitions

"(Frequency reference) oscillator" herein refers to the whole device including in particular the resonator, the actuator and the thermostatic controller as herein described.

"Resonator (element)" herein refers to a silicon-based element suspended to a supporting structure so as to be capable of resonating in a resonance mode. The resonator may be a composite resonator comprising e.g. differently doped silicon layers and/or any other material layers, as required e.g. by piezoelectric actuation, and suspended with the silicon body.

"Transducer" herein means the means used to couple acoustic waves to/from the resonator. The transducer may be part of the resonator element (e.g. in piezoelectric actuation) or arranged outside of it (e.g. electrodes of electrostatic actuation).

"Actuator" herein refers to necessary driving and sensing circuitry for operating the resonator and sensing the frequency of the resonator using the transducer.

TCF1, TCF2 and TCF3 refer to first, second and third order derivatives of the frequency-vs-temperature curve, respectively, typically evaluated at a temperature of 25° C. Terms "slope" and "curvature" are used when referring to the first and second derivatives of the frequency-vs-temperature curve at the turnover temperature.

Here "ppb" and "ppm" refer to relative units of parts per billion (10-9) or parts per million (10-6), respectively.

"Turnover point" refers to a local extremum of the frequency-vs-temperature curve of the resonator. A turnover temperature (TTO) is the corresponding temperature value of the turnover point. Thus, at the turnover temperature, the slope of the frequency-vs-temperature curve of the resonator is zero, whereby in the vicinity of a turnover temperature, changes in temperature are minimally reflected in the frequency of the resonator. In the present disclosure, at least one turnover temperature higher than 85° C. is utilized for being able to achieve stability over normal operating temperatures without cooling arrangements.

"Degenerate doping" herein means doping to an impurity concentration of $9*1019$ cm-3 or more. The doping agent can be e.g. phosphorus or some other n-type agent.

Description of Selected Embodiments

Figure 1A:
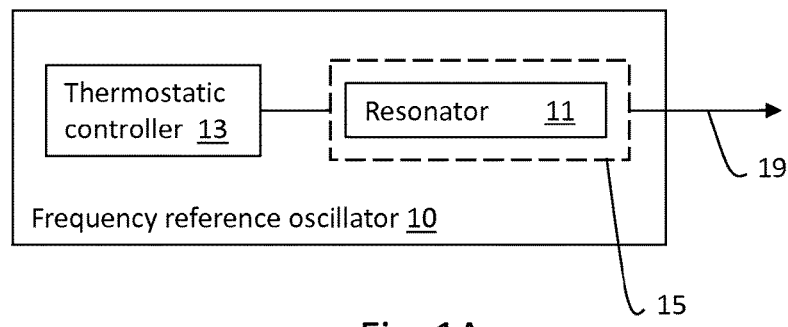
FIG. 1A shows a block diagram of key parts of the present oscillator.

FIG. 1A shows a resonator 11 placed inside an oven 15. The temperature of the oven 15 is regulated by a thermostatic controller 13. The readout signal of the oscillator is obtained at output 19.

Next, resonators are discussed which have two turnover temperatures, at least one of which is at a temperature higher than 85° C. and which are capable of providing a notably smaller absolute value of curvature than 50 ppb/C2 of the frequency-vs-temperature curve at the turnover point.

Figure 1B:
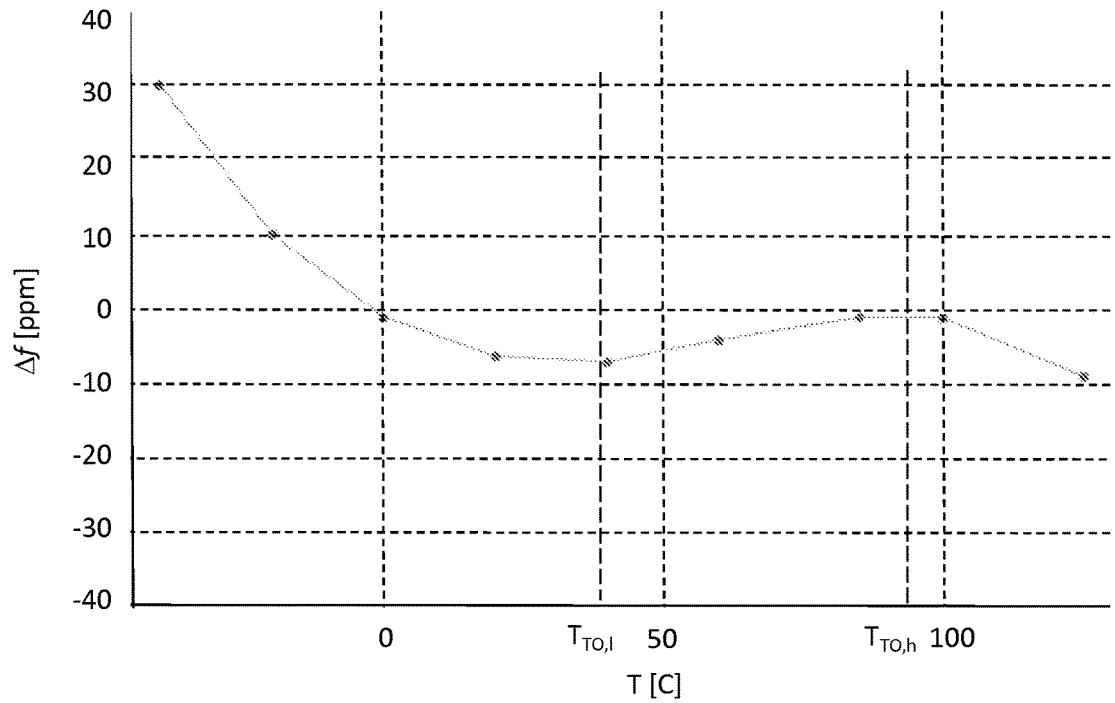
FIG. 1B illustrates a frequency-vs-temperature graph of an aluminum-nitride thin-film coupled MEMS resonator showing a turn-over temperature higher than 85° C. (TTO, h=95° C.).

FIG. 1B shows an example of a frequency-vs-temperature curve measured from a rectangular plate resonator with a silicon doping concentration of more than $1.3*1020$ cm-3. It is notable that the illustrated frequency-vs-temperature curve herein has, in accordance with the aspects of the disclosed embodiments, two turnover temperatures TTO,l, TTO,h, one at about 40° C. and one at about 95° C. The latter one would be chosen as the target temperature of the oven. The estimated curvature at the higher turnover point at temperature TTO,h is less than 10 ppb/C2 in magnitude.

The resonator can be a composite structure, comprising for example a stack of different materials. In particular, the resonator may comprise a plate comprising a first layer and a second layer on top of the first layer, the layers having different TCF characteristics. In one embodiment, the linear TCFs of the first layer structure and the second layer structure have opposite signs. In particular, the second layer of the composite can be a piezoelectric actuation layer.

In some embodiments, the resonator element comprises a silicon body, a piezoelectric layer on the body and an electrode layer on the piezoelectric layer, wherein the actuator is electrically connected to the electrode layer and to said silicon body for exiting the chosen resonance mode. Piezo-electrically actuated plate resonators have been found to exhibit the advantageous temperature behavior in accordance with the aspects of the disclosed embodiments and, when used as a part of an oscillator, to exhibit low phase noise and be well adjustable to the exact center frequency desired. In addition, the temperature behavior of the piezoelectric layer can be taken advantage of for providing the dominance of second and third order temperature coefficients of frequency (TCF2 and TCF3) over the first order term (TCF1) and so as to provide the high-temperature turnover point.

Figures 2A, 2B:
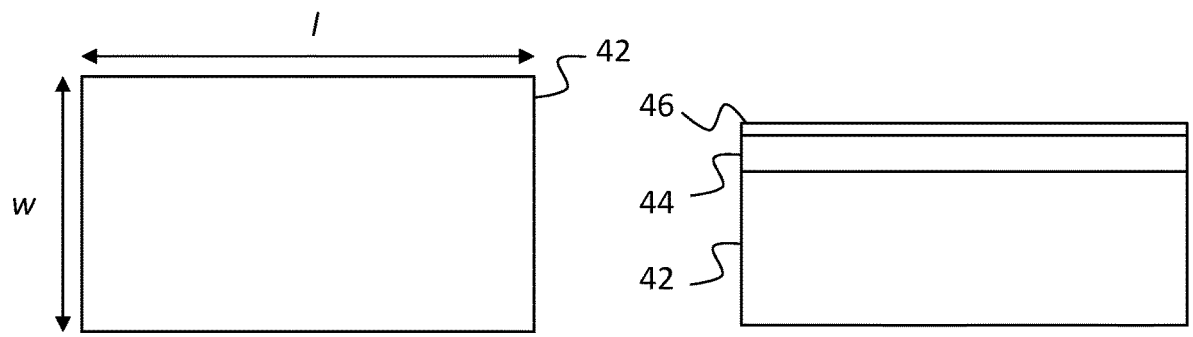
FIGS. 2A and 2B show in top and side views an exemplary piezoelectrically actuated rectangular plate resonator.

FIGS. 2A and 2B illustrate a piezoelectrically actuated composite resonator, with a thin film transducer layer 44 superimposed on a rectangular silicon body 42 to provide strong coupling and low phase noise when the resonator is used as a part of an oscillator. The thin film transducer layer 44 is typically a piezoelectric AlN layer. On top of it there is an additional electrode layer 46, such as a molybdenum layer. The silicon body 42 can serve as another electrode. In some embodiments, there are also provided one or more additional layers, such as a layer of passivation material, which, when processed on top of other layers can make the underlying materials chemically inactive.

Piezoelectric actuation as such is discussed more extensively e.g. in publication Jaakkola, A. et al, "Piezoelectrically Transduced Single-Crystal-Silicon Plate Resonators." In IEEE Ultrasonics Symposium, 2008. IUS 2008, 717-20, 2008.

Alternatively, the resonator may be electrostatically actuated. Electrostatic actuation provides weaker coupling between the resonator and the transducers, but better long-term stability. The principles discussed herein are applicable to electrostatically actuated single-crystal resonators and composite resonators as well.

The resonator can be e.g. shaped as a plate, such as a rectangular plate or a beam. The length direction of the plate or the beam may be at an angle of 0-45 degrees with respect to the [100] crystalline direction of the silicon material. Both these geometric parameters, i.e. the aspect ratio and the angle, can be adjusted, together with material parameters and the modal branch or branches used, so as to yield a turnover temperature higher than 85° C.

The design and fabrication process of the present oscillator may comprise, in any relevant order or in an iterative process, the steps of choosing a resonator geometry, choosing a resonator material comprising doped silicon, and choosing actuation means capable of making the resonator to oscillate in a chosen resonance mode. For example, one can first choose any resonance mode that as such exhibits a frequency-vs-temperature curve with a positive TCF1. In one example, a plate geometry length extensional mode (first or any higher-order LE mode) is chosen. Then, one can choose plate geometry and/or plate material (stack) that brings the TCF1 zero or close to zero. For example, one can select the plate aspect ratio and/or angle with respect to the silicon crystal, and/or thickness of a piezoelectric actuation layer on top of the silicon plate. Finally, a doping concentration of silicon is chosen that makes the second and third order behaviour of the resonator dominant over the first-order behaviour.

Then, it is evaluated whether the resonator geometry, resonator material, actuation means and resonance mode chosen produce a frequency-vs-temperature curve having at least two turnover points, at least one of which is a high-temperature turnover point at a high turnover temperature of 85° C. or more. Evaluation may be based on simulations or experiments. In the affirmative case, an oscillator with such resonator is fabricated, also providing into the oscillator a thermostatic controller for keeping the temperature of the resonator element at the high turnover temperature.

In some embodiments, the resonance mode is chosen such that when the in-plane aspect ratio of the plate resonator (i.e. the ratio of the plate resonator's length to its width) and/or its angle with respect to the [100] crystal direction of the silicon material is varied, the characteristics of the resonator change as a function of the aspect ratio and/or the angle. Characteristics of interest are, for example, the resonance frequency and the temperature coefficients of frequency, i.e. TCF1, TCF2 and higher order coefficients, and the electromechanical coupling strength of the transducer used for excitation and sensing. Of the various possible aspect ratios or angles, one is chosen that yields the high turnover temperature together with other design parameters.

To mention some practically feasible examples, the resonator can be a composite width extensional/square extensional resonator in which the aspect ratio or a composite in-plane flexural/length extensional plate or beam resonator, is chosen, along with other parameters, to yield the high turnover temperature. These examples are discussed below in more detail.

Jaakkola, Antti. "Piezoelectrically Transduced Temperature Compensated Silicon Resonators for Timing and Frequency Reference Applications." Doctoral dissertation, Aalto University, 2016 and US 2016/0099704 discuss in general the second order temperature behaviour of resonators below 85° C. The second order temperature coefficient TCF2 of a silicon resonator can attain at room temperature positive values, when the n-type dopant concentration is above about $1.1*10^{20}$ cm-3. The linear TCF (TCF1) and the second order temperature coefficient TCF2 can be made simultaneously very close to zero with certain configuration concerning the doping level and resonator geometry, and when doping is still increased, TCF2 reaches positive values, which is seen as an upward opening parabola in the frequency-vs-temperature curve between −40 . . . +85° C. It has, however now been found that at high temperatures, above 85° C., the curve deviates from the upward opening parabola and "bends down". In other terms, the frequency-vs-temperature curve is not fully described by a second order polynomial, but has considerable third order characteristic. This third order effect, or "bending down" of the frequency-vs-temperature curve, results in a low-curvature local maximum on the frequency-vs-temperature curve above 85° C., like shown in FIG. 1B, making the resonator suitable for ovenization to stabilize its frequency over the ambient temperature range of a variety of electronic products.

Exemplary approaches are presented below for obtaining frequency-vs-temperature characteristic curve having two turnover points for a silicon resonator. The approaches are thus applicable for resonators having an average dopant concentration of $1.1*10^{20}$ cm-3 or higher, in particular $1.3*10^{20}$ cm-3 or higher, and which may or may not have additional material layers such as piezoelectric and metal layers related to piezoelectric actuation. The approaches are based on utilizing the characteristics of width extensional/square extensional (WE/SE) and in-plane flexural (IFP1), out-of-plane flexural (OPF1), or length extensional/Lame (LE/Lame) modal branches (as referred to in the abovementioned dissertation).

Figure 3B:
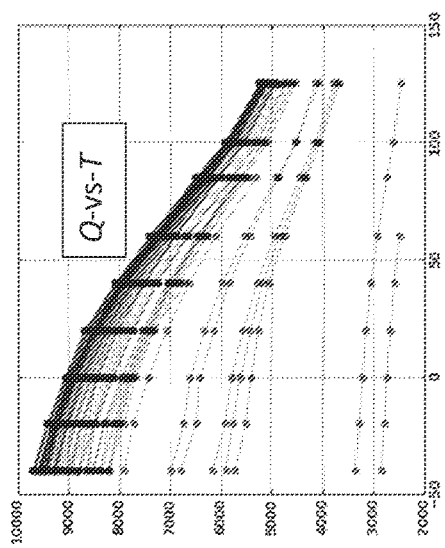
FIGS. 3A-3F show performance charts measured from 100 WE/SE-mode resonators fabricated on a development-phase wafer, the charts showing the initial frequency distribution (3A), temperature dependence of resonance frequency (3B), quality factor Q (3C), figure of merit FOM (FOM=1/(2*pi*f*C0*Rm)) (3D), electromechanical resistance Rm (3E), and shunt capacitance C0 (3F).
Figure 3A:
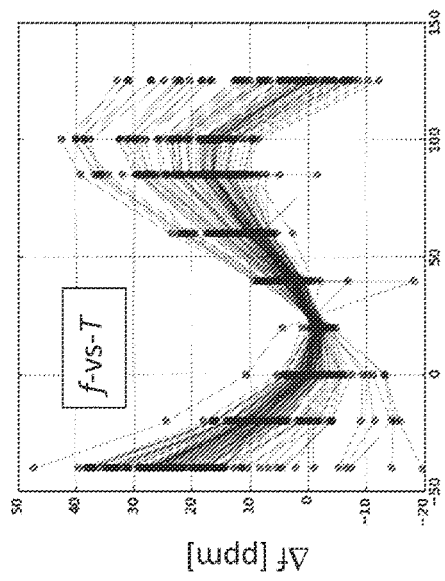
Figure 3C:
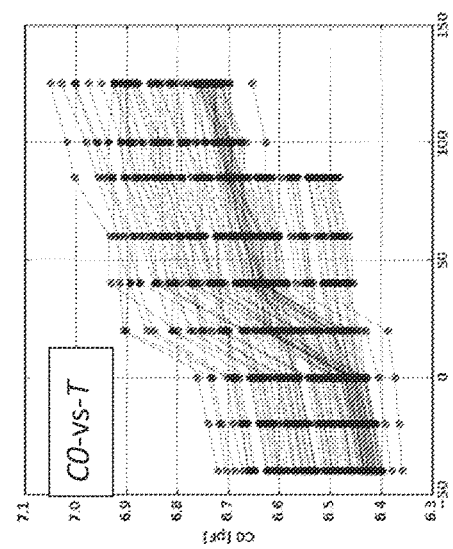
Figure 3F:
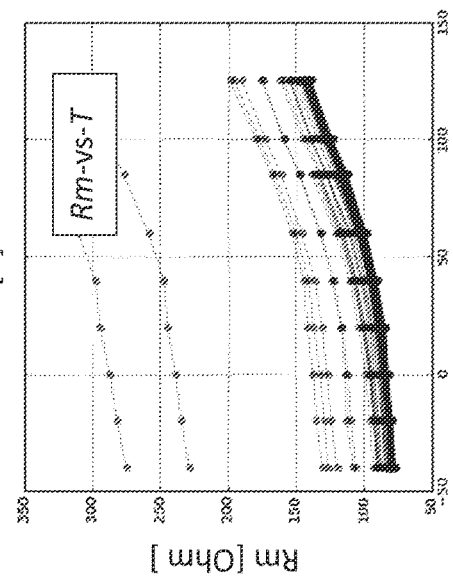
Figure 3E:
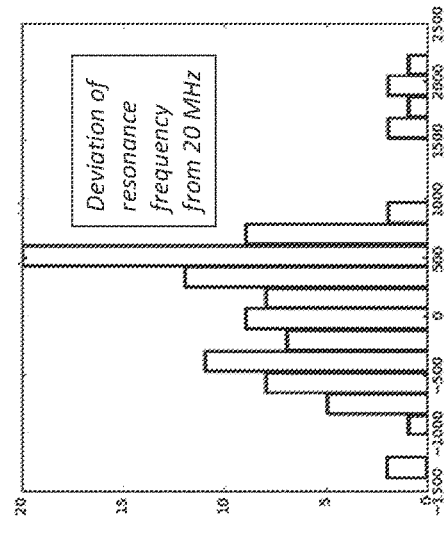
Figure 3D:
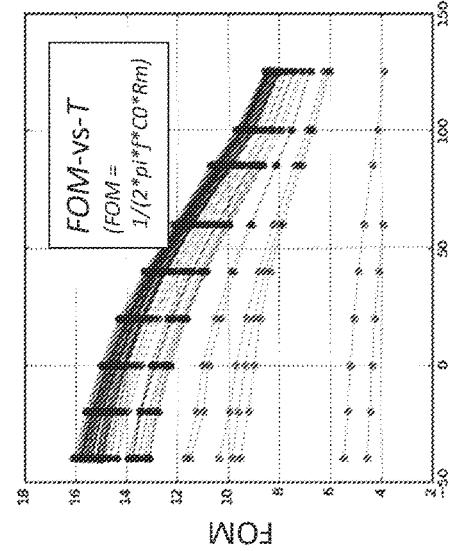

The WE/SE branch: There is a square extensional/width extensional mode branch for plate resonators having a length and a width. By moving on the branch from aspect ratio 1 towards higher aspect ratio, one can find a configuration where TCF1 is near to zero. In accordance with the present disclosure, using this aspect ratio, not only is TCF1 zeroed, but the remaining (positive) TCF2 and (negative) TCF3 result in a third order frequency-vs-temperature curve having the two turnover temperatures, like those in FIG. 1B or 3B. Examples of FIGS. 1B and 3B are measured from devices which have been created by going through the above described approach. The resonators are piezoelectrically actuated 20-MHz resonators on the SE-WE modal branch, and the resonator dimensions are the following: the composite resonator consists of 20-micrometer-thick layer of phosphorus-doped silicon with dopant concentration above $1.3*10^{20}$ cm-3, 1-micrometer-thick layer of aluminium nitride (AlN), and 0.3-micrometer layer of molybdenum as the top electrode. The resonator has a rectangular shape, and its width and length are 188 and 378 micrometers. It should be noted that by scaling the in-plane dimensions of this design, and maintaining the ratios between the thicknesses of the material layers constant, resonators at a wide range of frequencies can be produced.

The optimal aspect ratio for the above described case of a piezoelectrically actuated resonator has been found to be close to 2 (length to width). Since the optimum aspect ratio depends on the exact doping concentration, thickness of the resonator, and on possibly added other material layers, which add their own contribution to TCF1, the practically usable aspect ratio may deviate from 2 by 10% at maximum, typically by 5% at maximum. The effects of other material layers to TCF2 and TCF3 are smaller. The optimal aspect ratio in each case can be found by experimentally testing resonator designs which have different aspect ratios, varied with small steps, or correspondingly through simulations.

In particular, for a similar resonator (from the SE/WE modal branch) which uses the electrostatic actuation, as an alternative of piezoelectric actuation, there would not be any added material layers in addition to silicon, and thus the optimal aspect ratio would be less than 2, i.e., somewhere between 1 and 2.

Thus, in the generic case, the aspect ratio of the resonator is different from 1.

Being experimental results, FIGS. 1B and 3A-3F also demonstrate the feasibility of the present disclosure for industrial use.

The characteristics of the in-plane flexural (IFP1), out-of-plane flexural (OPF1), or length-extensional/Lamé (LE/Lamé) modal branches can be utilized in a similar manner as the characteristics of the WE/SE branch, discussed above. Here the parameter to vary is, instead of the aspect ratio of resonator, the alignment of the beam-shaped resonator with respect to [100] crystalline direction.

By moving on the IPF1, IPF2 or LE modal branches with small steps in angular alignment with the [100] direction, one can find a configuration where TCF1 is near to zero. In accordance with the present disclosure, in this configuration, the remaining (positive) TCF2 and (negative) TCF3 result in a third order frequency-vs-temperature curve having the two turnover temperatures, like those in FIG. 1B or 3B.

It should be noted that both the in-plane aspect ratio of the resonator and the angular alignment direction can be varied simultaneously to find configurations that result in a third order f-vs-T curve having the two turnover temperatures, like those in FIG. 1B or 3B.

The exact deviation of direction of the beam with respect to the [100] crystalline direction depends on the thickness of the resonator, and on possibly added other material layers, which add their own contribution to TCF1. The effects of other material layers to TCF2 and TCF3 are smaller.

Summarizing the aforementioned, in some embodiments, the resonator element comprises a silicon base layer having an n-type dopant concentration of 1.3*1020 cm-3 or above, an aluminum nitride transducer layer, and a conductive electrode layer superimposed on top of each other. The element is shaped as a plate or beam, whose geometry yields, an essentially zero TCF1, a positive TCF2, and a negative TCF3 that bring one turnover point of the frequency-vs-temperature curve of the resonator to the high temperature range.

According to one specific example, the resonator has the characteristics of a resonator disclosed in a still non-published Finnish patent application 20165553.

The exact turnover temperature can be adjusted as desired by design and by fabrication process. For example, by moving on a modal branch, such as on the SE-WE modal branch towards higher aspect ratios, the turnover temperature can be made higher. Similarly, by moving on the in-plane flexural (IFP1), out-of-plane flexural (OPF1), or length-extensional/Lamé modal branches towards closer alignment with the [100] direction, the turnover temperature can be made higher. Also, thinner additional material layers having a negative TCF1 result in higher turnover temperature. Such layers can be for example the piezoelectric layers or the top electrode layer. Possibility to adjust the turnover temperature is beneficial as concerns the industrial production of the present oscillator.

Depending on exact design choices, one can achieve either a single high-temperature turnover point in the frequency-vs-temperature curve, as illustrated in FIG. 4A (doping concentration c=9*1019-1.3*1020 cm-3), a curve with two high-temperature turnover points, as illustrated in FIG. 4B (c>1.1*1020 cm-3), or a curve with one high- and one low-temperature turnover point, as illustrated in FIG. 4C (c>1.1*1020 cm-3). The concentration limits for the cases are overlapping, since, for example, added material layers can bring their own contribution to the f-vs-T curve, although most of the characteristics of the f-vs-T curve is dictated by the doped silicon properties. In each case, low curvature of 20 ppb/C2 or less at the high-temperature turnover point can be achieved.

The present resonator can be the only resonator in the oscillator (a single-resonator oscillator), or one resonator out of many (multi-resonator oscillator).

The thermostatic controller herein preferably includes a heater, such as a resistive heater, placed in the vicinity of the resonator. In addition, there is a temperature sensor, such as a thermistor, for measuring the temperature of each resonator to be temperature-regulated, and a control circuitry capable of using the heater for setting the temperature of the resonator to a predefined value.

The resonator is placed in a micro oven, which means a thermally isolated space containing the heater and the temperature sensor. The sensor may be a single-point or a multi-point sensor, in which case the temperature value can be averaged from several locations inside the oven, or the thermostatic controller can use temperature values from the several locations to implement a more complex control function.

If desired, the driving circuit of the resonator and/or the thermostatic control circuitry may be placed inside an oven, which may also be the same as the resonator oven. This can further improve the accuracy and stability of the oscillator.

The invention claimed is:

1. A temperature-compensated microelectromechanical oscillator comprising:
   a resonator element comprising silicon, doped to an average doping concentration of at least $1.1*10^{20}$ cm$^{-3}$,
   an actuator comprising a piezoelectric actuation layer for exciting the resonator element into a resonance mode having a characteristic frequency-vs-temperature curve having two turnover points, one of the turnover points being high-temperature turnover point at a turnover temperature of 85° C. or more, and
   a thermostatic controller for keeping the temperature of the resonator element at said high turnover temperature.

2. The oscillator according to claim 1, wherein one of said two turnover points is a low-temperature turnover point located at a temperature of less than 85° C.

3. The oscillator according to claim 2, wherein the frequency-vs-temperature curve has at said high-temperature turnover point a smaller absolute value of curvature than at said low-temperature turnover point.

4. The oscillator according to claim 1, wherein the frequency-versus-temperature curve has exactly two turnover points within the temperature range of −40 to and including +150° C.

5. The oscillator according to claim 1, wherein said high-temperature turnover point is a local maximum.

6. The oscillator according to claim 1, wherein said high-temperature turnover point is a local minimum.

7. The oscillator according to claim 1, wherein the absolute value of curvature of the frequency-vs-temperature curve at said high-temperature turnover point is 20 ppb/C$^2$ or less.

8. The oscillator according to claim 1, wherein said high-temperature turnover point is at a turnover temperature of 200° C. or less.

9. The oscillator according to claim 1, wherein the resonator element comprises:
   a silicon body having an n-type dopant concentration of 1.3*10$^{20}$ cm$^{-3}$ or above,
   the piezoelectric actuation layer, such as an aluminum nitride layer, on the silicon body,
   an electrode layer on the piezoelectric actuation layer, and wherein the piezoelectric actuation layer is electrically connected to the electrode layer and to said silicon body for exciting said resonance mode.

10. The oscillator according to claim 1, wherein the resonator element is a plate element, such as a rectangular plate element, with an in-plane aspect ratio different from 1.

11. The oscillator according to claim 1, wherein the resonance mode is in a square extensional/width extensional modal branch.

12. The oscillator according to claim 1, wherein the resonance mode is in an in-plane flexural, out-of-plane flexural, or length-extensional/Lame modal branch.

13. The oscillator according to claim 1, wherein the resonator element is shaped as a plate or beam, whose geometry yields for the element in said resonance mode an essentially zero first order temperature coefficient of frequency (TCF1) along with second order temperature coefficients of frequency (TCF2) characteristics and third order temperature coefficients of frequency (TCF3) characteristics that provide at least two turnover points, one of which is said high-temperature turnover point.

14. The oscillator according to claim 1, wherein the doped silicon has a crystal orientation, and the resonator element has at least one main axis having an angle with respect to the crystal orientation, wherein said angle is in a range of 0 to and including 45 degrees.

15. The oscillator according to claim 1, wherein the thermostatic controller is adapted to operate independently of the oscillation frequency of the resonator element.

16. A method of fabricating a microelectromechanical oscillator, comprising:
   choosing a resonator geometry,
   choosing a resonator material comprising doped silicon having an average doping concentration of 1.1*10$^{20}$ cm$^{-3}$ or more,
   choosing actuation means comprising a piezoelectric actuation layer for providing said resonator material in said resonator geometry to oscillate in a resonance mode,
   evaluating whether the resonator geometry, resonator material, actuation means and resonance mode chosen produce a frequency-vs-temperature curve having two turnover points, one of the turnover points being, a high-temperature turnover point at a turnover temperature of 85° C. or more, and, in the affirmative,
   fabricating the oscillator with said resonator geometry, resonator material, and actuation means, wherein said fabricating additionally comprises providing a thermostatic controller for keeping a temperature of the resonator element at said high turnover temperature.

17. The method according to claim 16, wherein said choosing of the resonator geometry comprises choosing a rectangular plate geometry or beam geometry.

18. The method according to claim 16, wherein said choosing of the resonator material comprises choosing a stack of materials comprising a first layer comprising doped silicon having an average doping concentration of 1.3*10$^{20}$ cm$^{-3}$ or more.

19. The method according to claim 16, wherein said resonance mode is in a square extensional/width extensional modal branch or in an in-plane flexural, out-of-plane flexural, or length extensional/Lamé modal branch.

* * * * *